United States Patent
Law

(10) Patent No.: US 9,905,424 B1
(45) Date of Patent: Feb. 27, 2018

(54) SELF-ALIGNED NON-MANDREL CUT FORMATION FOR TONE INVERSION

(71) Applicant: GLOBALFOUNDRIES Inc., Grand Cayman (KY)

(72) Inventor: Shao Beng Law, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/494,803

(22) Filed: Apr. 24, 2017

(51) Int. Cl.
*H01L 21/033* (2006.01)
*H01L 21/768* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/76816* (2013.01); *H01L 21/76877* (2013.01)

(58) Field of Classification Search
None
See application file for complete search history.

(56) References Cited

U.S. PATENT DOCUMENTS

| | | | | |
|---|---|---|---|---|
| 6,955,961 | B1 * | 10/2005 | Chung | H01L 21/0337 257/E21.038 |
| 8,057,692 | B2 * | 11/2011 | Park | H01L 21/0337 216/41 |
| 8,298,943 | B1 | 10/2012 | Arnold et al. | |
| 9,337,033 | B1 | 5/2016 | Glodde et al. | |
| 9,368,350 | B1 | 6/2016 | He et al. | |
| 9,373,543 | B1 * | 6/2016 | Mont | H01L 21/76808 |
| 2006/0263699 | A1 * | 11/2006 | Abatchev | H01L 21/0337 430/5 |
| 2012/0329268 | A1 * | 12/2012 | Soda | H01L 21/0337 438/631 |
| 2014/0148012 | A1 | 5/2014 | Guillorn et al. | |
| 2014/0273476 | A1 | 9/2014 | Cheng et al. | |
| 2014/0315380 | A1 * | 10/2014 | Kanakasabapathy | H01L 21/76802 438/618 |
| 2016/0035571 | A1 * | 2/2016 | Chang | H01L 21/0338 438/703 |

* cited by examiner

*Primary Examiner* — Andres Munoz
(74) *Attorney, Agent, or Firm* — Thompson Hine LLP; Anthony Canale

(57) ABSTRACT

Methods of forming self-aligned non-mandrel cuts during the fabrication of an interconnect structure. A first dielectric hardmask layer is formed on a metal hardmask layer. A plurality of mandrels are formed on the first dielectric hardmask layer, and a plurality of spacers are formed on the first dielectric hardmask layer. The spacers are located adjacent to the mandrels. A first sacrificial layer is formed that fills spaces between the spacers, and a second dielectric hardmask layer is formed on the first sacrificial layer, the spacers, and the mandrels. A plurality of sections of a second sacrificial layer are formed on the second dielectric hardmask layer and cover the second dielectric hardmask layer over a plurality of areas that are used to form the non-mandrel cuts.

20 Claims, 4 Drawing Sheets

SELF-ALIGNED NON-MANDREL CUT FORMATION FOR TONE INVERSION

BACKGROUND

The present invention relates to integrated circuits and semiconductor device fabrication and, more specifically, to methods for forming self-aligned non-mandrel cuts during the fabrication of an interconnect structure.

A back-end-of-line (BEOL) interconnect structure may be used to connect device structures fabricated on a substrate during front-end-of-line (FEOL) processing with each other and with the environment external to the chip. Self-aligned patterning processes used to form a BEOL interconnect structure involve mandrels as sacrificial features that establish a feature pitch. Sidewall spacers, which have a smaller thickness than permitted by the current ground rules for optical lithography, are formed adjacent to the vertical sidewalls of the mandrels. After selective removal of the mandrels, the sidewall spacers are used as an etch mask to etch an underlying hardmask, for example, with a directional reactive ion etch (RIE) process. Unmasked features in the pattern are transferred from the hardmask to an interlayer dielectric layer to define trenches in which the wires of the BEOL interconnect are formed.

Cuts may be formed in mandrels with a cut mask and etching in order to section the mandrels and define gaps that may be subsequently used to produce wires that are spaced apart at their tips with a tip-to-tip spacing. A pattern reflecting the cut mandrels may be transferred to the hardmask and subsequently from the hardmask to the patterned interlayer dielectric layer. Non-mandrel cuts may also be formed in the hardmask itself and define gaps that may be filled by dielectric material when the sidewall spacers are formed. The filled gaps may be subsequently used to produce wires that are spaced apart at their tips with a tip-to-tip spacing. A pattern reflecting the non-mandrel cuts may also be transferred to the hardmask and subsequently from the hardmask to the patterned interlayer dielectric layer.

Improved methods of forming self-aligned non-mandrel cuts during the fabrication of an interconnect structure are needed.

SUMMARY

In an embodiment of the invention, a method includes forming a first dielectric hardmask layer on a metal hardmask layer, forming a plurality of mandrels on the first dielectric hardmask layer, and forming a plurality of spacers on the first dielectric hardmask layer that are located adjacent to the mandrels. A first sacrificial layer is formed that fills spaces between the spacers, and a second dielectric hardmask layer is formed on the first sacrificial layer, the spacers, and the mandrels. A plurality of sections of a second sacrificial layer are formed on the second dielectric hardmask layer and cover the second dielectric hardmask layer over a plurality of areas that are used to form a plurality of non-mandrel cuts.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 11 is a top view of the structure at the fabrication stage of FIG. 10 and in which FIG. 10 is taken generally along line 10-10.

DETAILED DESCRIPTION

Figure 1:
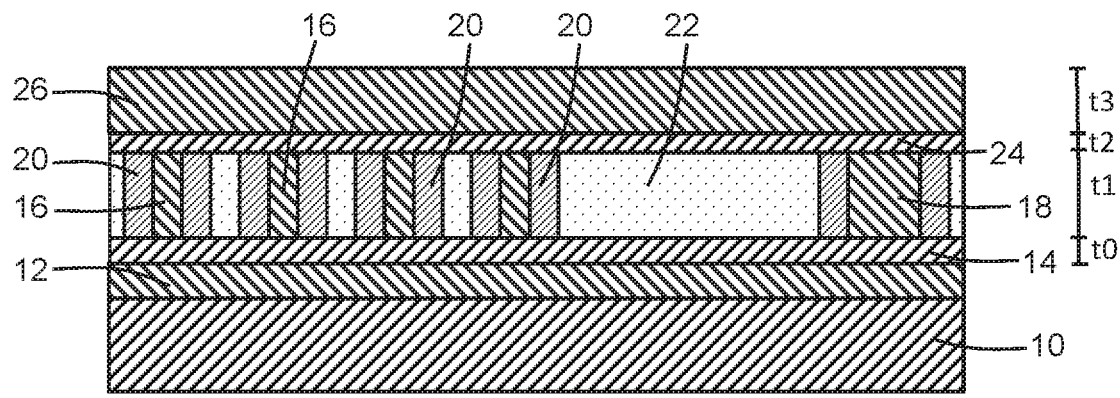
FIGS. 1-10 are respective cross-sectional views of a structure at successive fabrication stages of a processing method in accordance with embodiments of the invention.

With reference to FIG. 1 and in accordance with embodiments of the invention, an interlayer dielectric layer 10 may be comprised of an electrically-insulating dielectric material, such as hydrogen-enriched silicon oxycarbide (SiCOH) produced from an octamethylcyclotetrasiloxane (OMCTS) precursor or another type of low-k dielectric material. The interlayer dielectric layer 10 may be located on a substrate that includes device structures fabricated by front-end-of-line (FEOL) processing to form an integrated circuit.

A hardmask layer 12 is located on the top surface of the interlayer dielectric layer 10. The hardmask layer 12 may be comprised of a metal, such as titanium nitride (TiN), deposited by physical vapor deposition (PVD). The hardmask layer 12 is removable from the interlayer dielectric layer 10 selective to the material of the interlayer dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

A dielectric hardmask layer 14 is formed with a given thickness, t0, on the hardmask layer 12. The dielectric hardmask layer 14 may be comprised of a dielectric material, such as silicon nitride ($Si_3N_4$), deposited by chemical vapor deposition (CVD). In an alternative embodiment, the dielectric hardmask layer 14 may be comprised of a different dielectric material, such as silicon dioxide ($SiO_2$). The material constituting the dielectric hardmask layer 14 is chosen to be removable from the hardmask layer 12 selective to the material of the hardmask layer 12.

Mandrels 16, 18 are formed on a top surface of the dielectric hardmask layer 14. The mandrels 16, 18 may be concurrently formed by depositing a blanket layer of a sacrificial material on the entire top surface of the dielectric hardmask layer 14 and patterning the blanket layer by lithography and etching using a lithography stack. For example, a sidewall image transfer (SIT) process or a self-aligned double patterning (SADP) process may be used to pattern the mandrels 16, 18. At least one of the dimensions of mandrel 18, e.g., the width, may be greater than the corresponding dimension of mandrels 16.

Sidewall spacers 20 are formed at locations on the top surface of the dielectric hardmask layer 14 adjacent to the vertical sidewalls of the mandrels 16 and at locations on the top surface of the dielectric hardmask layer 14 adjacent to the vertical sidewalls of the mandrel 18. The sidewall spacers 20 and the mandrels 16, 18 are arranged lengthwise in parallel rows on the top surface of the dielectric hardmask layer 14. The sidewall spacers 20 may be formed by depositing a conformal layer comprised of a dielectric material with atomic layer deposition (ALD) and shaping the conformal layer with an anisotropic etching process, such as reactive ion etching (RIE). The anisotropic etching process preferentially removes the dielectric material from horizontal surfaces, such as the top surfaces of the dielectric hardmask layer 14 and the mandrels 16, 18 in deference to the dielectric material adjacent to the sidewalls of the mandrels 16, 18.

The material constituting the sidewall spacers 20 may be chosen so as to be removed by a given etch chemistry selective to the material of the mandrels 16, 18. For example, the dielectric material constituting the sidewall spacers 20 may be silicon dioxide ($SiO_2$), and the material constituting the mandrels 16, 18 may be silicon, which may be removed selective to silicon dioxide so that the mandrels 16, 18 can be pulled without removing the spacers 20. In alternative embodiments, the sidewall spacers 20 may be comprised of a different material, such as a metal oxide, with a similar etch selectivity relative to the mandrels 16, 18.

A sacrificial layer 22 may be applied by spin-coating to fill the gaps between the sidewall spacers 20 on the adjacent mandrels 16, 18. The sacrificial layer 22 may be comprised of, for example, an organic planarization layer (OPL) material or another spin-on material such as a spin-on metal (e.g., titanium dioxide ($TiO_2$) or hafnium dioxide ($HfO_2$)) or a spin-on glass (SOG). The sacrificial layer 22 is etched back to be coplanar with the mandrels 16, 18, which exposes the respective top surfaces of the mandrels 16, 18. After planarization, the mandrels 16, 18 and the sacrificial layer 22 have the same thickness, t1.

A dielectric hardmask layer 24 is applied on a top surface of the mandrels 16, 18 and the sacrificial layer 22. The dielectric hardmask layer 24 may be comprised of a dielectric material, such as silicon nitride ($Si_3N_4$), deposited by CVD. In an alternative embodiment, the dielectric hardmask layer 24 may be comprised of a different dielectric material, such as silicon dioxide ($SiO_2$). The dielectric hardmask layer 14 and the dielectric hardmask layer 24 may be comprised of the same dielectric material. The identity of the materials for the dielectric hardmask layers 14, 24 provides, among other shared physical and chemical properties, the same etch selectivity to other materials. In an embodiment, the thickness, t2, of the dielectric hardmask layer 24 is less than the thickness of the dielectric hardmask layer 14.

A mandrel layer 26 is deposited on the top surface of the dielectric hardmask layer 24. The material for the mandrel layer 26 is chosen to be removed selective to the material of the dielectric hardmask layer 24. The mandrel layer 26 may be comprised of silicon (Si), such as amorphous silicon, or carbon (C), such as amorphous carbon, deposited at a low temperature by CVD. In an embodiment, the mandrel layer 26 and the mandrels 16, 18 may be comprised of the same material. The identity of the materials for the mandrel layer 26 and the mandrels 16, 18 provides, among other shared physical and chemical properties, the same etch selectivity to other materials. In an embodiment, the thickness, t3, of the mandrel layer 26 may be less than the thickness (i.e., vertical height) of the mandrels 16, 18.

Figure 2:
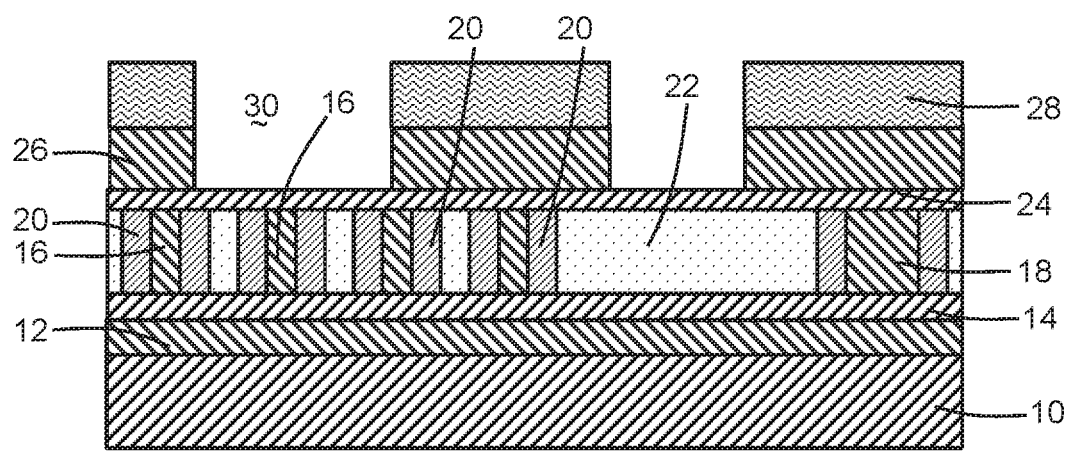

With reference to FIG. 2 in which like reference numerals refer to like features in FIG. 1 and at a subsequent fabrication stage of the processing method, the mandrel layer 26 is patterned to define sections that are horizontally separated by open spaces. To pattern the mandrel layer 26, a lithography stack 28 is applied to the top surface of the mandrel layer 26 and patterned to define openings 30 that are aligned with different areas of the mandrel layer 26. The lithography stack 28 may include, for example, an organic planarization layer, an anti-reflective coating, and a layer of photoresist. An etching process is used to transfer the openings 30 from the lithography stack 28 into the mandrel layer 26 in order to pattern the mandrel layer 26.

Figure 3:
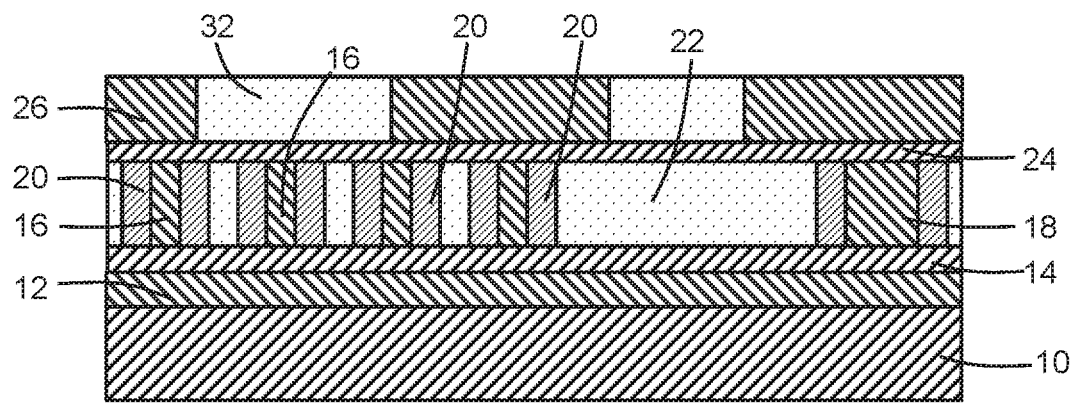

With reference to FIG. 3 in which like reference numerals refer to like features in FIG. 2 and at a subsequent fabrication stage of the processing method, the lithography stack 28 is stripped from the mandrel layer 26. A sacrificial layer 32, which operates as a tone inversion layer, may be applied by spin-coating as a gap-fill material with sections that fill the openings 30 in the mandrel layer 26. The top surface of the sacrificial layer 32 is etched back to be coplanar with the top surface of the mandrel layer 26.

The sacrificial layer 32 may have a thickness that is less than the thickness of the sacrificial layer 22. The thickness of the mandrels 16, 18 establishes the thickness of the sacrificial layer 22, and the thickness of the mandrel layer 26 establishes the thickness of the sacrificial layer 32. Because the thickness of the mandrels 16, 18 is greater than the thickness of the mandrel layer 26, the sacrificial layer 22 is likewise thicker than the sacrificial layer 32.

The sacrificial layer 32 may be comprised of, for example, an organic planarization layer (OPL) material. Alternatively, the sacrificial layer 32 may be comprised of another type of spin-on material, such as a spin-on metal (e.g., titanium dioxide ($TiO_2$) or hafnium dioxide ($HfO_2$)) or a spin-on glass (SOG). The sacrificial layer 32 may be comprised of the same material as the sacrificial layer 22. The identity of the materials for the sacrificial layers 22, 32 provides, among other shared physical and chemical properties, identical etch selectivities to other materials.

The mandrel layer 26 and the sacrificial layer 32 may be comprised of various combinations of materials with etch properties and gap-fill properties that provide the requisite functionality for tone inversion. The material of the mandrel layer 26 is removable selective to the material of the sacrificial layer 32 so that an inverted pattern (i.e., a complementary pattern) can be transferred from the patterned mandrel layer 26 to the sacrificial layer 32.

In an embodiment, the mandrel layer 26 may be comprised of amorphous silicon and the sacrificial layer 32 may be comprised of OPL material or spin-on carbon (SOC). In an embodiment, the mandrel layer 26 may be comprised of amorphous silicon and the sacrificial layer 32 may be comprised of a spin-on metal (e.g., titanium dioxide ($TiO_2$) or hafnium dioxide ($HfO_2$)), a spin-on glass (SOG), or another type of spin-on material with the requisite etch selectivity to amorphous silicon and acceptable gap-fill properties. In an embodiment, the mandrel layer 26 may be comprised of amorphous carbon and the sacrificial layer 32 may be comprised of titanium dioxide ($TiO_2$), spin-on glass (SOG), or another type of spin-on material with the requisite etch selectivity to amorphous carbon and acceptable gap-fill properties.

Figure 4:
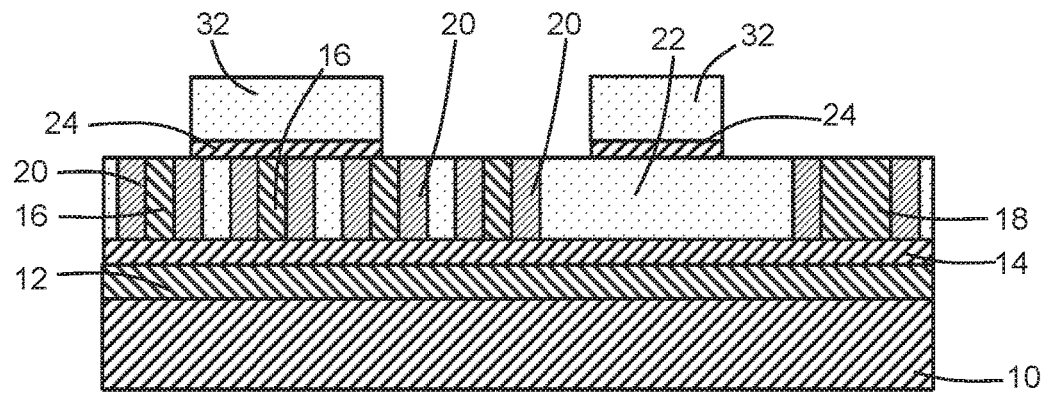

With reference to FIG. 4 in which like reference numerals refer to like features in FIG. 3 and at a subsequent fabrication stage of the processing method, the patterned mandrel layer 26 is removed selective to the material of the dielectric hardmask layer 24 with an etching process having a suitable etch chemistry. The top surface of the dielectric hardmask layer 24 is revealed over areas from which the mandrel layer 26 is pulled to complete the tone inversion. Discrete sections of the sacrificial layer 32, which were arranged in the spaces between the sections of the mandrel layer 26, remain on the top surface of the dielectric hardmask layer 24.

The dielectric hardmask layer 24 is then opened over areas that are not masked by the portions of sacrificial layer 32. To that end, the unmasked areas of the dielectric hardmask layer 24 are removed selective to the materials of the mandrels 16, 18, the spacers 20, and sacrificial layer 22 with an etching process having a suitable etch chemistry. Portions of the sacrificial layer 22 are covered by the sacrificial layer 32 and dielectric hardmask layer 24. Other portions of the sacrificial layer 22 are exposed through the openings formed in the sacrificial layer 32 and dielectric hardmask layer 24.

Figure 5:
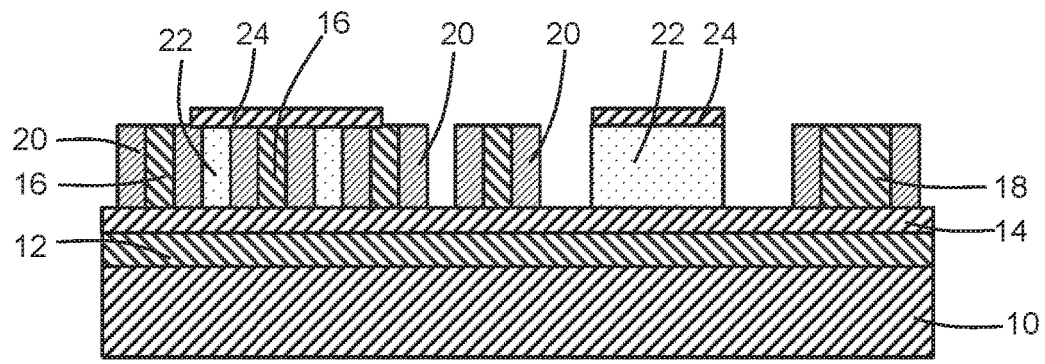

With reference to FIG. 5 in which like reference numerals refer to like features in FIG. 4 and at a subsequent fabrication stage of the processing method, portions of the sacrificial layer 22 in the spaces between spacers 20 and in the space between mandrels 16 and mandrel 18 are removed with, for example, an etching process. These portions of the sacrificial layer 22 are not masked by the dielectric hardmask layer 24. The etching process is chosen to remove the sacrificial layer 22 selective to dielectric hardmask layer 24. The discrete portions of the sacrificial layer 32 remaining on the top surface of the dielectric hardmask layer 24 are also removed by the etching process. The larger thickness of the sacrificial layer 22, in comparison with the thickness of the sacrificial layer 32, ensures that the sacrificial layer 32 is completely removed from the dielectric hardmask layer 24 when opening the sacrificial layer 22 over areas that are not masked by the dielectric hardmask layer 24.

Over areas masked by the dielectric hardmask layer 24, sections of the sacrificial layer 22 are preserved. Some of these sections of the sacrificial layer 22 are located in the spaces between adjacent sidewall spacers 20, and eventually provide non-mandrel cuts defining tip-to-tip or end-to-end spaces between adjacent conductive features formed in the interlayer dielectric layer 10.

Figure 6:
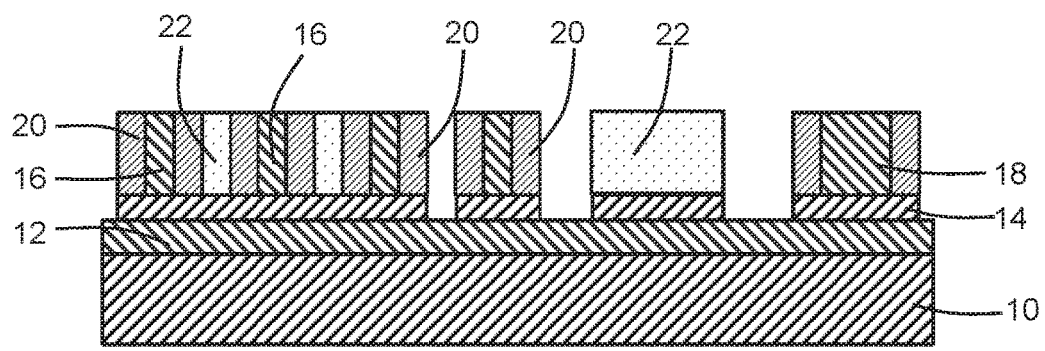

With reference to FIG. 6 in which like reference numerals refer to like features in FIG. 5 and at a subsequent fabrication stage of the processing method, the dielectric hardmask layer 14 is etched with an etching process that removes the dielectric hardmask layer 14 selective to the hardmask layer 12, as well as the spacers 20, mandrels 16, 18, and the sacrificial layer 22. The remaining sections of the dielectric hardmask layer 24 are removed when the dielectric hardmask layer 14 is opened. The larger thickness of the dielectric hardmask layer 14, in comparison with the thickness of the dielectric hardmask layer 24, ensures that the remaining sections of the dielectric hardmask layer 24 are completely removed when opening the dielectric hardmask layer 14 over areas of the dielectric hardmask layer 14 that are not masked. The preserved sections of the sacrificial layer 22, which are located between adjacent sidewall spacers 20, are initially covered by corresponding sections of the dielectric hardmask layer 24 and are intact after the dielectric hardmask layer 14 is opened. A preserved section of the sacrificial layer 22, which is located between the mandrels 16 and the mandrel 18, is initially covered by a corresponding section of the dielectric hardmask layer 24 and is also intact after the dielectric hardmask layer 14 is opened.

Figure 7:
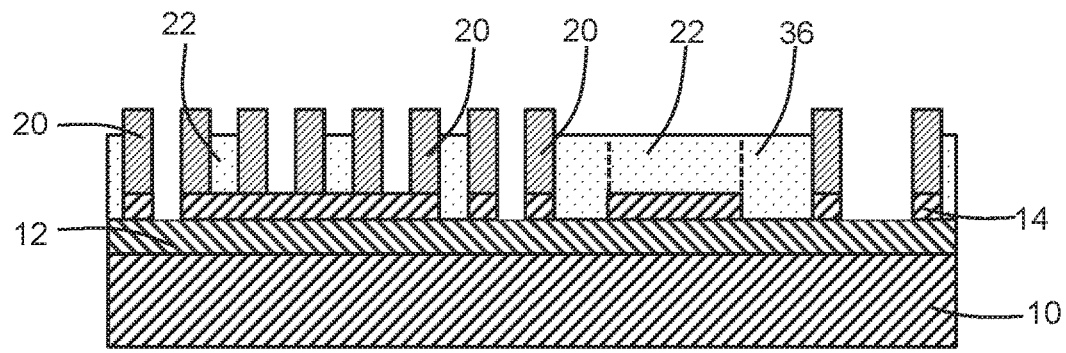

With reference to FIG. 7 in which like reference numerals refer to like features in FIG. 6 and at a subsequent fabrication stage of the processing method, a sacrificial layer 36 comprised of, for example, an organic planarization layer (OPL) material may be applied by spin-coating and etched back, along with sacrificial layer 22, to expose the top surfaces of the mandrels 16, 18. The mandrels 16, 18 are subsequently removed selective to the sidewall spacers 20 with an etching process having a suitable etch chemistry. The top surface of the dielectric hardmask layer 14 is revealed over areas on its top surface that are exposed when the mandrels 16, 18 are pulled. Sections of the sacrificial layer 36 fill the openings in the dielectric hardmask layer 14 that are opened in the dielectric hardmask layer 14 when the dielectric hardmask layer 24 is removed.

Figure 8:
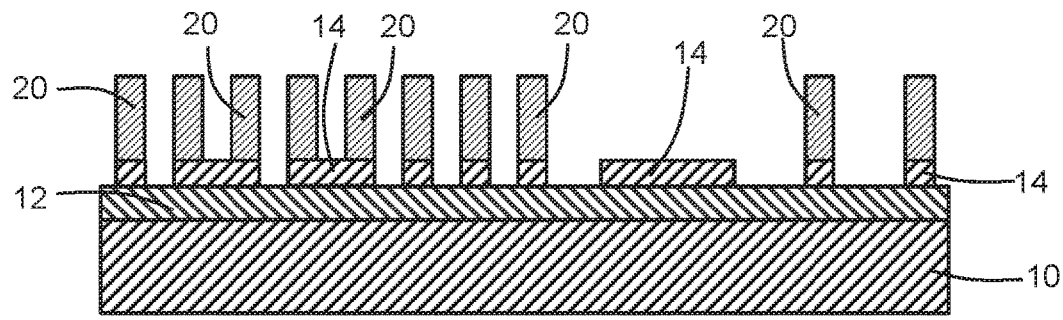

With reference to FIG. 8 in which like reference numerals refer to like features in FIG. 7 and at a subsequent fabrication stage, the dielectric hardmask layer 14 is subsequently patterned by an etching process with the sidewall spacers 20 and the sections of the sacrificial layers 22, 36 operating as an etch mask. The etching process that opens the dielectric hardmask layer 14 may employ an etch chemistry that removes the material of the dielectric hardmask layer 14 that is not covered by the sidewall spacers 20 and sections of the sacrificial layers 22, 36. At the conclusion of the etching process, intact sections of the dielectric hardmask layer 14 are located vertically between the sidewall spacers 20 and the hardmask layer 12, as well as laterally between some of the sidewall spacers 20 and in the open area.

Figure 9:
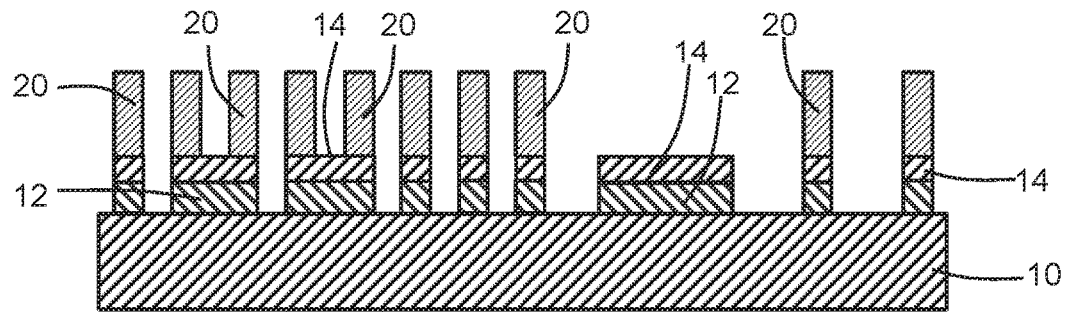

With reference to FIG. 9 in which like reference numerals refer to like features in FIG. 8 and at a subsequent fabrication stage, the sections of the sacrificial layers 22, 36 are stripped by a cleaning process after the mandrels 16, 18 are pulled. The hardmask layer 12 is then patterned by an etching process with the sidewall spacers 20 and the sections of the dielectric hardmask layer 14 operating as an etch mask. The etching process may employ an etch chemistry that removes the material of the hardmask layer 12 selective to the materials of the sidewall spacers 20 and the dielectric hardmask layer 14, as well as selective to the material of the interlayer dielectric layer 10.

The sidewall spacers 20 mask the hardmask layer 12 and the intervening sections of the dielectric hardmask layer 14 over areas on the top surface of the hardmask layer having the same shape and area. Sections of the hardmask layer 12 are preserved and retained during its etching in elongated strips over these areas that are covered by the sidewall spacers 20 and the intervening sections of the dielectric hardmask layer 14. Between some of the sidewall spacers 20 and over a given area on the top surface of the hardmask layer 12, sections of the dielectric hardmask layer 14 mask the hardmask layer 12. Sections of the hardmask layer 12 are likewise preserved and retained during its etching over the areas covered by these sections of the dielectric hardmask layer 14.

Figure 10:
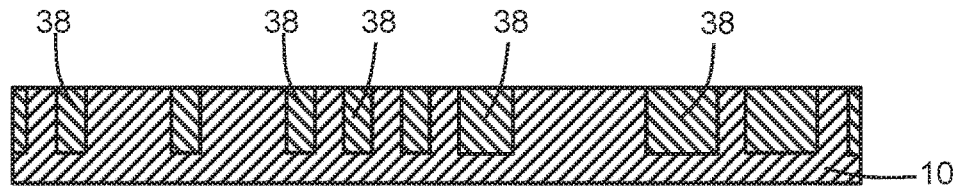
Figure 11:
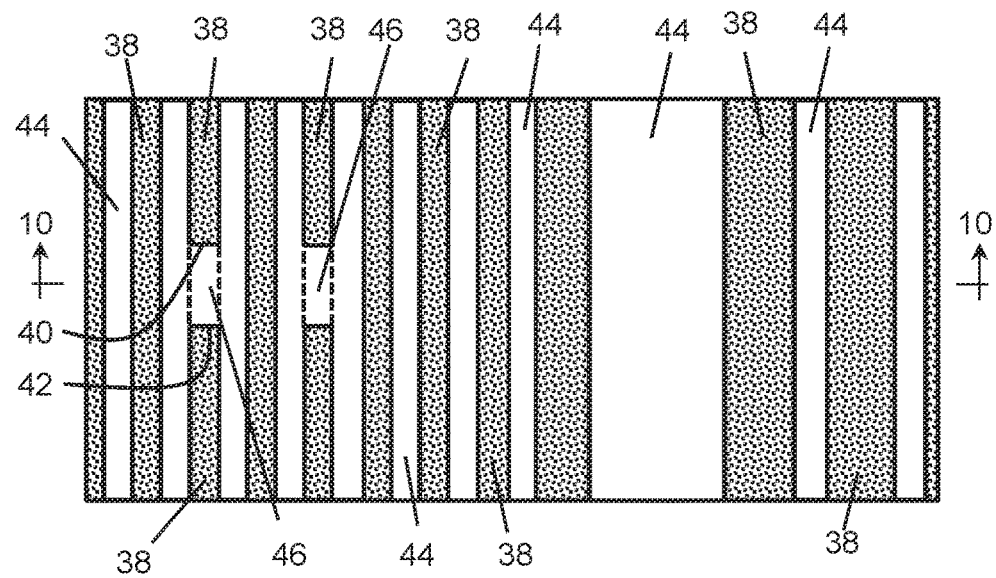

With reference to FIGS. 10 and 11 in which like reference numerals refer to like features in FIG. 9 and at a subsequent fabrication stage, the sidewall spacers 20 and sections of the dielectric hardmask layer 14 beneath the sidewall spacers 20 may be removed by one or more etching processes. The interlayer dielectric layer 10 is etched using the hardmask layer 12 as a patterned etch mask to remove the interlayer dielectric layer 10 in unmasked areas and thereby form trenches in the interlayer dielectric layer 10. Those masked areas in which the interlayer dielectric layer 10 is not etched, and therefore retained, are determined by the areas of the hardmask layer 12 that are covered by the dielectric hardmask layer 14 and the sidewall spacers 20 when the hardmask layer 12 is patterned. After the interlayer dielectric layer 10 is etched, the hardmask layer 12 may be selectively removed by an etching or cleaning process.

The trenches in the interlayer dielectric layer 10 are filled with a conductor to form wires 38 of different dimensions. A liner (not shown) comprised of titanium (Ti), titanium nitride (TiN), tantalum (Ta), tantalum nitride (TaN), or a layered combination of these materials (e.g., a bilayer of Ti/TiN) may be applied to the trenches before filling with the metal. The wires 38 may be comprised of a low-resistivity conductor formed using a deposition process, such as a metal like copper (Cu) formed by electroplating or electroless deposition.

The shapes and geometries of the wires 38 reproduce the shapes and geometries of the patterned features in the hardmask layer 12. Adjacent pairs of wires 38 are separated from each other in one lateral direction by strips 44 of the electrical insulator of the interlayer dielectric layer 10. At the locations of non-mandrel cuts, a section 46 of the interlayer dielectric layer 10 is located between some of the pairs of wires 38 and, in particular, between the end 40 of one of the wires 38 and an end 42 of another of the wires 38 in end-to-end linear alignment with the other wire 38. The dielectric material of each section 46 bridges and joins the dielectric material of the adjacent strips 44 flanking these linearly-aligned wires 38 such that the wires 38 are electrically isolated from each other. When the interlayer dielectric layer 10 is etched, these strips 44 and sections 46 are masked by areas of the hardmask layer 12.

Figure 12:
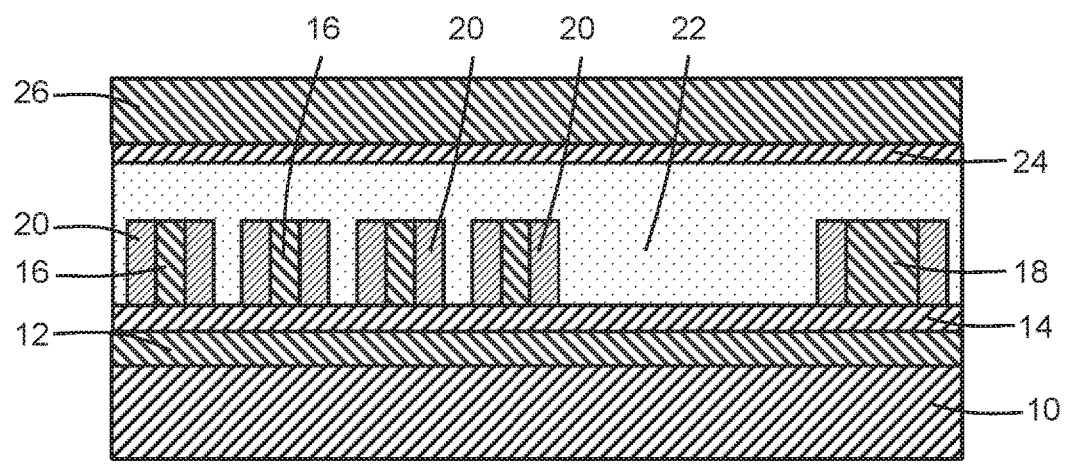
FIG. 12 is a cross-sectional view of a structure at successive fabrication stages of a processing method in accordance with alternative embodiments of the invention.

With reference to FIG. 12 in which like reference numerals refer to like features in FIG. 1 and in accordance with embodiments of the invention, the sacrificial layer 22 may be applied with a thickness that is greater than the thickness (i.e., height) of the mandrels 16, 18. For example, the sacrificial layer 22 may be applied with spin-coating to fill the gaps between the sidewall spacers 20 and with the enhanced thickness, but the etch back may not be performed. The enhanced thickness of the sacrificial layer 22 may be effective to lessen or eliminate topography in the sacrificial layer 22 originating from the topography of the underlying mandrels 16, 18 and spacers 20, which in turn may reduce critical dimension variations of the mandrel layer 26 and the sacrificial layer 32.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smart-phones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first dielectric hardmask layer on a metal hardmask layer;
    forming a plurality of mandrels on the first dielectric hardmask layer;
    forming a plurality of spacers on the first dielectric hardmask layer that are located adjacent to the plurality of mandrels;
    forming a first sacrificial layer that fills spaces between the plurality of spacers;
    forming a second dielectric hardmask layer on the first sacrificial layer, the plurality of spacers, and the plurality of mandrels; and
    forming a plurality of sections of a second sacrificial layer on the second dielectric hardmask layer that cover the second dielectric hardmask layer over a plurality of first areas that are used to form a plurality of non-mandrel cuts.

2. The method of claim 1 wherein the first sacrificial layer and the second sacrificial layer are comprised of the same material.

3. The method of claim 1 wherein the first sacrificial layer is thicker than the second sacrificial layer.

4. The method of claim 1 wherein the first sacrificial layer and the second sacrificial layer have identical etch selectivities.

5. The method of claim 1 wherein the first dielectric hardmask layer is thicker than the second dielectric hardmask layer.

6. The method of claim 1 wherein the first dielectric hardmask layer and the second dielectric hardmask layer are comprised of the same material.

7. The method of claim 1 wherein the first dielectric hardmask layer and the second dielectric hardmask layer have identical etch selectivities.

8. The method of claim 1 wherein forming the plurality of sections of the second sacrificial layer on the second dielectric hardmask layer that cover the second dielectric hardmask layer over the plurality of first areas that are used to form the plurality of non-mandrel cuts comprises:
    depositing a mandrel layer on the second dielectric hardmask layer;
    patterning the mandrel layer to form a plurality of sections;
    filling spaces between the plurality of sections of the mandrel layer with the plurality of sections of the second sacrificial layer; and
    removing the plurality of sections of the mandrel layer selective to the plurality of sections of the second sacrificial layer.

9. The method of claim 8 wherein the first sacrificial layer and the plurality of mandrels have a first thickness, and the plurality of sections of the mandrel layer and the plurality of sections of the second sacrificial layer have a second thickness that is less than the first thickness.

10. The method of claim 8 wherein the mandrel layer is comprised of a first material and the second sacrificial layer is comprised of a second material that is removable selective to the first material.

11. The method of claim 10 wherein the first material is amorphous silicon and the second material is a spin-on material with etch selectivity to amorphous silicon.

12. The method of claim 10 wherein the first material is amorphous carbon and the second material is a spin-on material with etch selectivity to amorphous carbon.

13. The method of claim 1 further comprising:
removing the second dielectric hardmask layer to open a plurality of second areas to the first sacrificial layer, the plurality of spacers, and the plurality of mandrels,
wherein the plurality of first areas of the second dielectric hardmask layer are masked by the second sacrificial layer.

14. The method of claim 13 further comprising:
removing the first sacrificial layer from the plurality of spaces between the plurality of spacers over the plurality of second areas to expose the first dielectric hardmask layer,
wherein the first sacrificial layer in the spaces between the plurality of spacers over the plurality of first areas is masked by the second dielectric hardmask layer when the first sacrificial layer is removed from the spaces between the plurality of spacers over the plurality of second areas.

15. The method of claim 14 further comprising:
after the first sacrificial layer is removed from the spaces between the plurality of spacers over the plurality of second areas, removing portions of the first dielectric hardmask layer unmasked by the removal of the first sacrificial layer from the spaces between the plurality of spacers over the plurality of second areas.

16. The method of claim 15 wherein the second dielectric hardmask layer is removed when the first dielectric hardmask layer is etched.

17. The method of claim 15 further comprising:
patterning the metal hardmask layer using the first dielectric hardmask layer as an etch mask.

18. The method of claim 17 wherein the metal hardmask layer is located on an interlayer dielectric layer, and further comprising:
after the metal hardmask layer is patterned, etching a plurality of plurality of trenches in the interlayer dielectric layer; and
filling the trenches with a conductor,
wherein a plurality of sections of the interlayer dielectric layer are masked in the spaces between the plurality of spacers over the plurality of first areas to form the plurality of non-mandrel cuts between pairs of the plurality of trenches.

19. The method of claim 1 wherein the first sacrificial layer projects above a top surface of the plurality of mandrels and the plurality of spacers.

20. The method of claim 19 wherein forming the plurality of sections of the second sacrificial layer on the second dielectric hardmask layer that cover the second dielectric hardmask layer over the plurality of first areas that are used to form the plurality of non-mandrel cuts comprises:
depositing a mandrel layer on the second dielectric hardmask layer;
patterning the mandrel layer to form a plurality of sections; and
filling spaces between the plurality of sections of the mandrel layer with the plurality of sections of the second sacrificial layer,
wherein the second sacrificial layer is coplanar with a top surface of sections of the mandrel layer, and the first sacrificial layer is thicker than the second sacrificial layer and the mandrel layer.

\* \* \* \* \*

UNITED STATES PATENT AND TRADEMARK OFFICE
CERTIFICATE OF CORRECTION

PATENT NO. : 9,905,424 B1  
APPLICATION NO. : 15/494803  
DATED : February 27, 2018  
INVENTOR(S) : Shao Beng Law Page 1 of 1

It is certified that error appears in the above-identified patent and that said Letters Patent is hereby corrected as shown below:

In the Claims  
At Column 10, Claim number 18, Line number 8, after "plurality of" delete "plurality of"

Signed and Sealed this  
Twenty-seventh Day of March, 2018

Andrei Iancu  
*Director of the United States Patent and Trademark Office*